United States Patent [19]

Urai

[11] Patent Number: 5,018,104
[45] Date of Patent: May 21, 1991

[54] REDUNDANT CIRCUIT INCORPORATED IN SEMICONDUCTOR MEMORY DEVICE

[75] Inventor: Takahiko Urai, Tokyo, Japan

[73] Assignee: NEC Corporation, Tokyo, Japan

[21] Appl. No.: 337,003

[22] Filed: Apr. 12, 1989

[30] Foreign Application Priority Data

Apr. 12, 1988 [JP] Japan .................................. 63-90519

[51] Int. Cl.[5] ...................... G11C 7/00; G11C 11/34
[52] U.S. Cl. ..................................... 365/200; 365/185
[58] Field of Search ............... 307/219, 441; 371/10.3, 371/15.1, 21.2, 21.4; 365/185, 184, 200, 201, 230.06; 324/158 T

[56] References Cited

U.S. PATENT DOCUMENTS 4,535,259 8/1985 Smarandoiu et al. ............... 365/200
4,567,580 1/1986 Varshney ............................ 365/200

Primary Examiner—James W. Moffitt
Assistant Examiner—Jack A. Lane
Attorney, Agent, or Firm—Sughrue,Mion,Zinn,Macpeak & Seas

[57] ABSTRACT

A redundant circuit incorporated in a non-volatile memory device has two memory transistors for memorizing a bit of address information one of which is used in a diagnostic operation of component circuits executed before the packaging and the other of which is used for memorizing a bit of address information assigned to a defective memory cell after the packaging, and, for this reason, the other memory transistor is free from the degradation due to the heat attack encountered in the packaging process.

5 Claims, 3 Drawing Sheets

PRIOR-ART

REDUNDANT CIRCUIT INCORPORATED IN SEMICONDUCTOR MEMORY DEVICE

FIELD OF THE INVENTION

This invention relates to a semiconductor memory device and, more particularly, to a redundant technique employed in the semiconductor memory device.

DESCRIPTION OF THE RELATED ART

The miniaturization of the component transistor has been promoting the increase of the number of component transistors per integrated circuit chip, however, this tendency encounters a problem in reduction of the production yield due to crystal defects of the semiconductor substrate. Various approaches have been proposed to enhance the production yield, and one of the approaches is related to a redundant technique in which defective memory cells are replaced with redundant memory cells. For provision of a memorizing facility for the replacement, fusible links are incorporated in the semiconductor memory device, and the fusible links are formed of polysilicon destructible with a laser beam or with a large amount of current applied thereto.

Non-volatile memory cells are also available for the memorizing facility and desirable for a non-volatile memory device with memory cells of the same structure, because no additional process such as, for example, a doping followed by a lithographic process is required for producing the memorizing facility. Typical examples of such a non-volatile memory device are disclosed in Japanese Patent Publication (Kokoku) Nos. 60-51200 and 62-40797, respectively, and are provided with non-volatile memory cells associated with protective means against an unintentional erasion of information of the replacement, and the non-volatile memory cells provide the memorizing facility for storing an address assigned to defective memory cells. FIG. 1 shows a part of a redundant unit which largely comprises a controller 1 and a memorizing facility 2. The memorizing facility 2 comprises a series combination of a switching transistor 3 formed by an n-channel type field effect transistor and an erasable and programmable memory cell 4 of the floating gate type coupled between a source of write-in voltage level Vpp and a ground node, a series combination of a switching transistor 5 formed by an n-channel type field effect transistor and a load transistor 6 coupled between a source of positive voltage level Vdd and the inverter circuit 7 coupled between the drain node of the erasable and programmable memory cell 4 and a switching circuit (not shown) which is operative to compare the output signal with a bit of the address signal to see whether or not the regular memory cell is replaced with a redundant memory cell.

When a bit of address information representative of logic "1" level is memorized into the erasable and programmable memory cell, the controller 1 provides the ground voltage level to the switching transistor 5 and the write-in voltage level Vpp to both of the switching transistor 3 and the erasable and programmable memory cell 4, respectively. With the ground voltage level, the switching transistor 5 turns off to block the conduction path between the source of positive voltage level Vdd and the inverter circuit 7, however, an avalanche break-down takes place around the drain region to inject hot electrons into the floating gate of the erasable and programmable memory cell 4, thereby causing the threshold voltage of the erasable and programmable memory cell 4. However, no write-in operation is carried out for storing a bit of address information representative of logic "0" level. After the memorization of the bit of address information, the controller 1 supplies the switching transistor 3 with the ground voltage level for blocking the conduction path between the source of the write-in voltage level Vpp and the erasable and programmable memory cell 4, however, the positive voltage level Vdd is supplied to both of the switching transistor 5 and the erasable and programmable memory cell 4. With the positive high voltage level Vdd, the switching transistor 5 turns on to allow the current from the source of positive voltage level Vdd to pass therethrough to the drain node of the erasable and programmable memory cell 4. However, whether or not the erasable and programmable memory cell 4 provides the conduction path to the ground node depends on the bit of address information. Namely, if the bit of address information is representative of logic "1" level, the current from the source of positive voltage level Vdd flows through the erasable and programmable memory cell 4, so that the inverter circuit 7 produces the output signal of logic "1" level. On the other hand, the bit of address information of logic "0" level causes the erasable and programmable memory cell 4 to block the conduction path to the ground node, and, for this reason, the inverter circuit 7 produces the output signal of logic "0" level which is supplied to the switching circuit (not shown).

A problem is encountered in the memorizing facility thus arranged in reliability of the stored address information. In detail, if the non-volatile memory cell is injected with the hot electrons and, thereafter, subjected to heat, the injected hot electrons are evacuated from the floating gate of the non-volatile memory cell, and the non-volatile memory cell tends to degrade in reliability. Prior to the separation into the chips, the semiconductor wafer on which a plurality of non-volatile memory devices have been fabricated is subjected to a diagnostic operation, and pieces of address informations are written into the memorizing facilities, respectively, if necessary. The semiconductor wafer is then separated into the semiconductor memory chips which are respectively sealed into packages of, for example, a glass seal. During the sealing process, the non-volatile memory devices are seriously subjected to be heat attacks, and, accordingly, the pieces of address information are liable to volatile, followed by the degradation. Particularly, if the memorizing facility is covered with the protective means such as a shield film, the address information should be written into the memorizing facility before the packaging stage, and, for this reason, the degradation is unavoidable.

SUMMARY OF THE INVENTION

It is therefore an important object of the present invention to provide a redundant circuit which is more reliable without increasing the complexity of the fabrication process.

To accomplish this object, the present invention proposes to provide not only a first memory transistor associated with a protective means for permanent storage but also a second memory transistor without any protective means for a diagnostic operation before the separation into the chips.

In accordance with the present invention, there is provided a redundant circuit incorporated in a nonvolatile semiconductor memory device including a redundant memory cell array provided with a plurality of redundant memory cells, a memory cell array provided with a plurality of memory cells each having a probability of a defective memory cell replaceable with the redundant memory cell, and addressing means responsive to an external address signal for specifying an address assigned to each of the memory cells for an access, the non-volatile semiconductor memory device being selectively established into a diagnostic mode of operation before a packaging thereof, a replacement mode of operation after the packaging operation and a read-out mode of operation, comprising: (a) a memorizing facility having a plurality of component parts each capable of storing a piece of address information and producing a bit of a memorized address signal representative of a piece of address information, the memorized address signal being representative of the address assigned to the memory cell decided as the defective memory cell; (b) replacing means supplied with the memorized address signal and with the external address signal and operative to produce an activation signal supplied to the redundant memory cell array and an inactivation signal supplied to the memory cell array for replacing the defective memory cell with the redundant memory cell in the read-out mode of operation; and (c) diagnostic mode establishing means responsive to a test-mode signal for causing the non-volatile memory device to be shifted into the diagnostic mode of operation, in which each of the component parts comprises (c-1) a series combination of a first switching transistor, a first intermediate node and a first memory cell coupled between a source of a write-in voltage level and a source of a first voltage level, the first memory cell being formed by an erasable and programmable read only memory, (c-2) protective means provided in association with the first memory cell and operative to prevent the first memory cell from an erasing operation, (c-3) a series combination of a second switching transistor, a load transistor, a second intermediate node and second memory means coupled between a source of a second voltage level and the source of the first voltage level, the first intermediate node being coupled to the second intermediate node, and (c-4) a controller producing first controlling signal for the first switching transistor, a second controlling signal for the second switching transistor, a third controlling signal for the first memory transistor and a fourth controlling signal for the second memory means and in which the controller causes the first and third controlling signals to shift into the write-in voltage level for memorizing the piece of address information of a first logic level and into an inactive voltage level for memorizing the piece of address information of a second logic level in the replacement mode of operation, wherein the controller further causes the first and fourth controlling signals to shift into the write-in voltage level for memorizing the piece of address information of the first logic level and into the inactive voltage level for memorizing the piece of address information of the second voltage level in the diagnostic mode of operation.

BRIEF DESCRIPTION OF THE DRAWINGS

The features and advantages of a redundant circuit according to the present invention will be more clearly understood from the following description taken in conjunction with the accompanying drawings in which.

DESCRIPTION OF THE PREFERRED EMBODIMENTS

First embodiment

Figure 1:
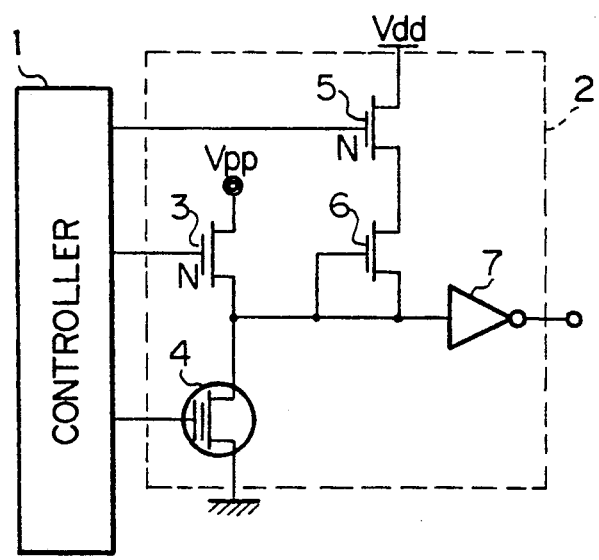
FIG. 1 is a circuit diagram showing the arrangement of a memorizing facility forming part of a redundant circuit incorporated in a prior art non-volatile semiconductor memory device.
Figure 2:
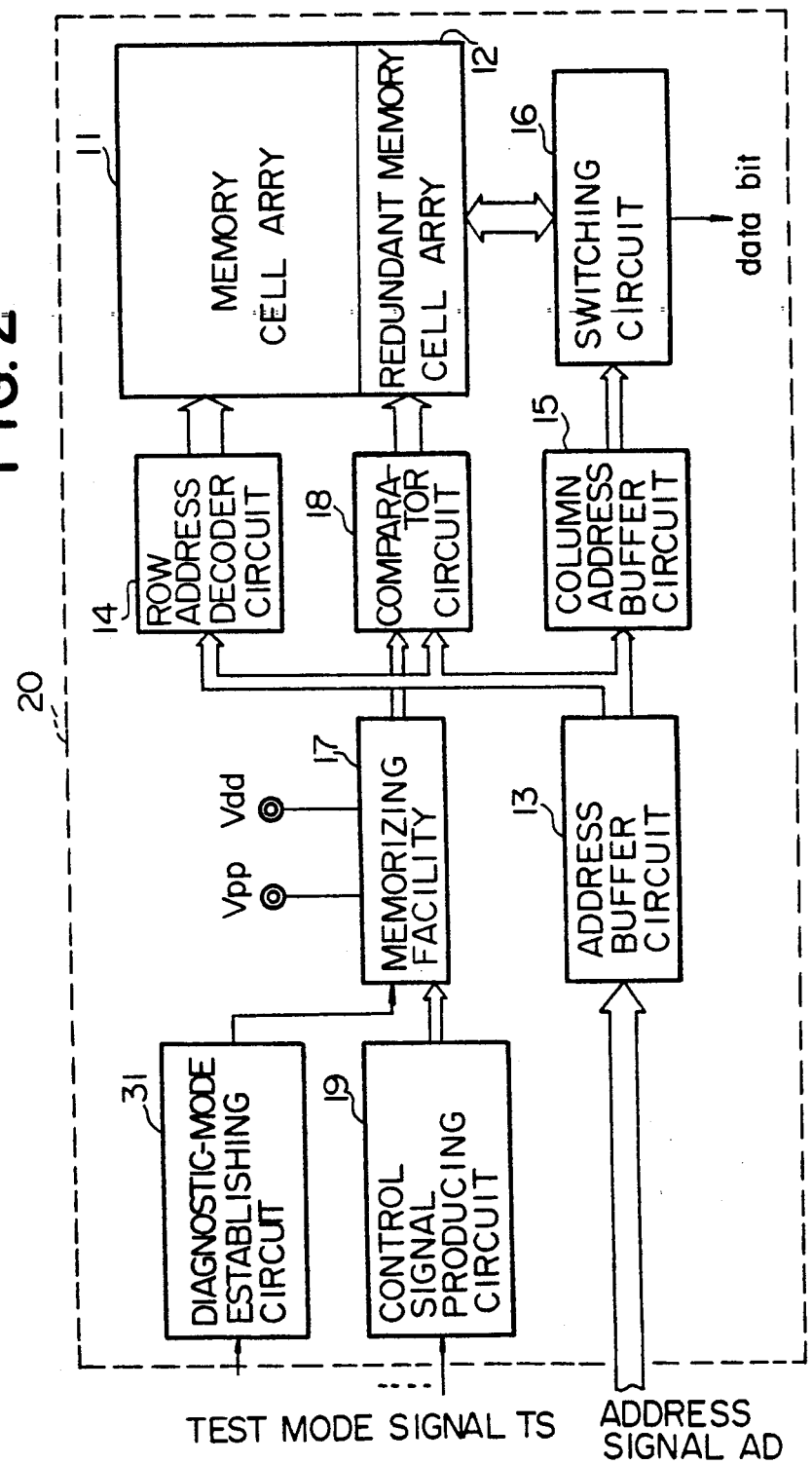
FIG. 2 is a block diagram showing the arrangement of a nonvolatile memory device to which the present invention is appertains.

Referring first to FIG. 2 of the drawings, a non-volatile memory device to which the present invention appertains largely comprises a memory cell array 11 having a plurality of regular memory cells of, for example, the erasable and programmable read only memory, a redundant memory cell array 12 with a plural rows of redundant memory cells each identical in structure with the regular memory cell, an address buffer circuit 13 supplied with a multiple-bit address signal AD, a column and row address buffer circuits 14 and 15 coupled in parallel to the address buffer circuit 13, a switching circuit 16 coupled to the column address buffer circuit 15 for multiplexing, a memorizing facility 17 for storing pieces of address information assigned to defective memory cells of the memory cell array 11, a comparator circuit 18 for comparing row address bits of the address signal AD with memorized address signals representative of the pieces of address information to see whether or not the regular memory cell accessed is replaced with the redundant memory cell, and a control signal producing circuit 19. The regular memory cells are of the erasable and programmable read only memory, and a data bit stored in each memory cell is erasable with an ultra-violet radiation. The non-volatile memory device thus arranged is fabricated on a single semiconductor chip 20, and the erasable and programmable read only memory cells are employed in the memorizing facility 17 for simplifying the fabrication process thereof.

Figure 3:
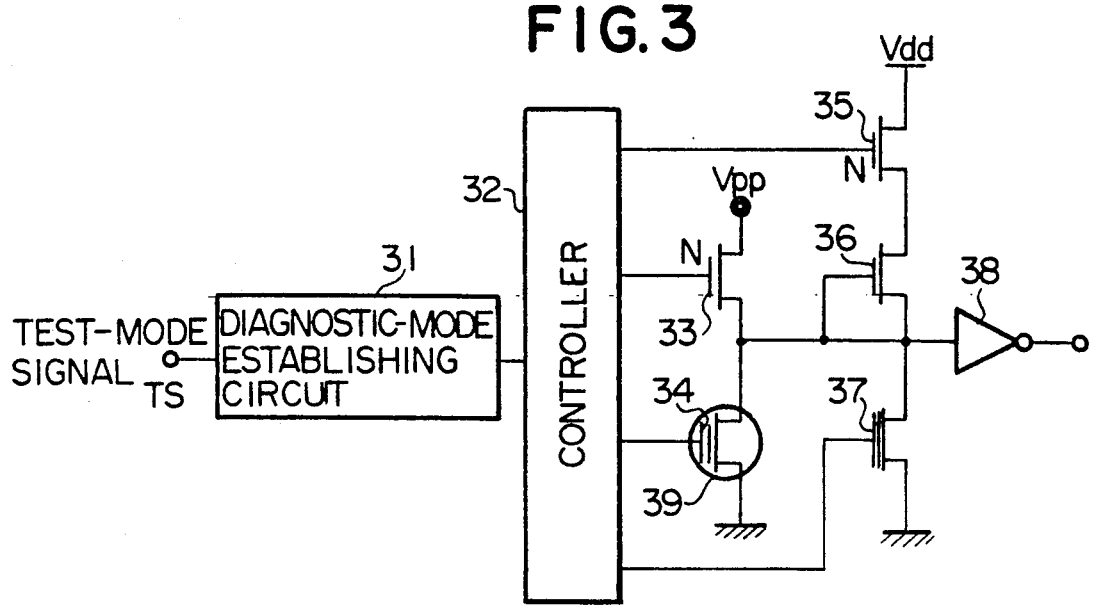
FIG. 3 is a circuit diagram showing the arrangement of a memorizing facility incorporated in the non-volatile memory device shown in 2.

Turning to FIG. 3 of the drawings, a component part of the memorizing facility 17 is illustrated and provided for a bit of the memorized address signal and associated with a diagnostic-mode establishing circuit 31. However, all of the component parts of the memorizing facility 17 are similar in circuit arrangement to one another, so that description is made for the part of the facility 17 only for the sake of simplicity.

The component part comprises a controller 32, a series combination of a first switching transistor 33 and a first memory transistor 34 coupled between a source of a write-in voltage Vpp and a ground node, a series combination of a second switching transistor 35, a load transistor 36 and a second memory transistor 37 coupled between a source of a positive voltage level Vdd lower than the write-in voltage level Vpp and the ground node, and an inverter circuit 38 coupled to the comparator circuit 18. The diagnostic-mode establishing circuit 31 is responsive to a test-mode signal TS, and the circuit 31 establishes a diagnostic mode of operation for the non-volatile memory device and, accordingly, the controller 32.

The controller 32 has a plurality of output nodes coupled in parallel to the gate electrodes of the first and second switching transistors 33 and 35 and the control gates of the first and second memory transistors 34 and 37. When the non-volatile memory device is established into a write-in mode of operation during the diagnostic-mode of operation carried out before the separation into the chips, the controller 32 supplies the gate electrode of the first switching transistor 33 and the control gate of the second memory transistor 37 with the write-in voltage level Vpp for memorizing logic "1" level, however, the write-in voltage level Vpp is supplied to not only the gate electrode of the first switching transistor 33 but also the control gate of the first memory transistor 34 upon the memorization of logic "1" level after the sealing into a package. The controller 32 provides the positive voltage level Vdd to the gate electrode of the second switching transistor 35 as well as the control gate of either memory transistor 34 or 37 in a read-out mode of operation.

The first and second switching transistors 33 and 35 are formed by n-channel type field effect transistors, respectively, and the first and second memory transistors 34 and 37 are of the erasable and programmable read only memory, and the bit of information memorized therein is erased with a ultra-violet radiation. The first memory transistor 34 is associated with protective means such as, for example, a shield film 39 of aluminum for protection against the ultra-violet radiation, however, no protective means are provided for the second memory transistor 37.

Description is hereinunder made for the diagnostic operation before the chip separation, a replacement operation after the packaging and a usual read-out mode of operation.

First, when a process sequence is completed for a wafer where the non-volatile memory device is fabricated, the non-volatile memory device is shifted to the diagnostic mode of operation with the test-mode signal TS, and the controller 32 supplies both of the control gate of the first memory transistor 34 and the gate electrode of the second switching transistor 35 with the ground voltage level, so that both transistors 35 and 34 remain in the off states. Whether or not the write-in voltage level Vpp is supplied to the gate electrode of the first switching transistor 33 as well as the control gate of the second memory transistor 37 depends on a bit of address information stored therein. Namely, if the bit of address information represents logic "1" level, the controller 32 provides the writein voltage level Vpp to both of the gate electrode of the first switching transistor 33 and the control gate of the second memory transistor 37, so that hot electrons produced by the avalanche break-down are injected into the floating gate of the second memory transistor 37, thereby allowing a conduction path to take place in the second memory transistor 37 in the read-out mode of operation. On the other hand, no write-in voltage is supplied to both of the gate electrode of the first switching transistor 33 and the control gate of the second memory transistor 37 for memorizing logic "0" level, and, for this reason, no conduction path is produced in the read-out mode of operation.

After the memorization of the bits of the address information, the ground voltage level is supplied to the gate electrode of the first switching transistor 33 and the control gate of the first memory transistor 34 and, accordingly, allows the transistors 33 and 34 to remain off for the read-out. mode of operation. The controller 32 further supplies the gate electrode of the second switching transistor 35 and the control gate of the second memory transistor 37 with the positive voltage level Vdd. Then, the second switching transistor 35 establishes a conduction path from the source of positive voltage level Vdd to the second memory transistor 37, however, the second memory transistor 37 blocks or allows the current to pass depending upon the bit of address information stored therein. Namely, if the bit of address information of logic "1" level has been memorized in the second memory transistor 37, the second memory transistor 37 provides the conduction path, and, for this reason, the inverter circuit produces a bit of the memorized address signal of logic "1" level. On the other hand, when the bit of address information of logic "0" level was memorized in the second memory transistor 37, the current from the source of positive voltage level Vdd hardly passes through the second memory transistor 37, and, accordingly, the inverter circuit 38 produces the bit of memorized address signal of logic "0"60 level. With the memorized address signal thus produced, the diagnostic operation is carried out for component units or circuits such as, for example, the comparator circuit 18.

When the diagnostic operation is completed, the wafer is separated into a plurality of non-volatile memory chips which are sealed into packages, respectively. After the packaging, the non-volatile memory device is subjected to an examination to see whether or not some defective memory cells are found in the memory cell array 11. If there is at least one defective memory cell, the replacement starts with the application of the ground voltage level to both of the gate electrode of the second switching transistor 35 and the control gate of the second memory transistor 37. The application of the write-in voltage level Vpp to both of the gate electrode of the first switching transistor 33 and the control gate of the first memory transistor 34 depends on a bit of address information assigned to the defective memory cell. If the bit of address information is of the logic "1", the write-in voltage Vpp is applied to both of the gate electrode of the first switching transistor 33 and the control gate of the first memory transistor 34 for causing the hot electrons to be injected into the floating gate of the first memory transistor 34. However, when the bit of address information is of the logic "0" level, no write-in voltage level Vpp is supplied to both of the gate electrode of the first switching transistor 33 and the control gate of the first memory transistor 34. In this manner, the bit of address information is memorized into the first memory transistor 34 and effectively retained in the non-volatile fashion, because of the shield film 39.

After the replacement of the defective memory cells with the redundant memory cells, the redundant memory cells are accessed instead of the defective memory cells. Namely, when the non-volatile memory device is shifted into the read-out mode of operation, the controller 32 supplies both of the gate electrode of the first switching transistor 33 and the control gate of the second memory transistor 37 with the ground voltage level so as to maintain these transistors 33 and 37 in the the respective off-states. The positive voltage level Vdd is supplied to both of the gate electrode of the second switching transistor 35 and the control gate of the first memory transistor 34. With the positive voltage level Vdd, the second switching transistor 35 turns on to provide the conduction path between the source of the positive voltage level Vdd and the first memory transistor 34, however, whether or not the first memory transistor 34 turns on depends on the logic level of the bit stored therein. Namely, if the bit of address information is logic "1" level, the conduction path takes place in the first memory transistor 34, so that the inverter circuit 38 produces the bit of the memorized address signal of logic "1" level. On the other hand, if the bit of logic "0" level is stored in the first memory transistor 34, no conduction path takes place therein, and, accordingly, the inverter circuit 38 produces the bit of the memorized address signal of logic "0" level.

The combinations of the controlling signals supplied from the controller 32 are summarized in Table 1.

TABLE 1

| Mode | 1st. S.W. Tr. | 1st. Memory Tr. | 2nd. S.W. Tr. | 2nd. Memory Tr. |
|---|---|---|---|---|
| A | Vpp or GND | GND | GND | Vpp or GND |
| B | GND | GND | Vdd | Vdd |
| C | Vpp or GND | Vpp or GND | GND | GND |
| D | GND | Vdd | Vdd | GND |

In Table 1, A, B, C and D respectively stand for the the write-in mode in the diagnostic operation, the read-out mode of operation after the mode A, the replacement mode of operation and the read-out mode of operation after the mode C, and the ground voltage level is abbreviated as GND.

As will be understood from the foregoing description, the first memory transistor 34 is not subjected with any heat attack after the injection of the hot electrons, and, for this reason, the first memory transistor 34 effectively maintains the bit of the address information for a prolonged time period without any undesirable evacuation of the hot electrons, thereby improving the reliability of the address information stored therein.

Second embodiment

Figure 4:
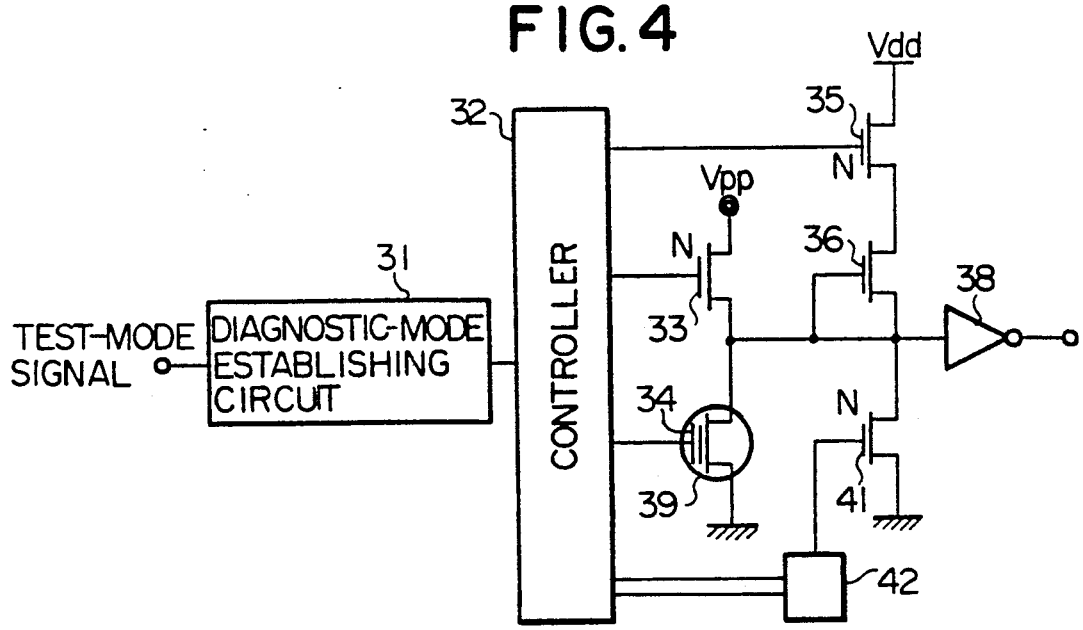
FIG. 4 is a circuit diagram showing the arrangement of another memorizing facility according to the present invention.

Turning to FIG. 4 of the drawings, another component part is illustrated. The component part is similar in circuit arrangement to that shown in FIG. 3 with an exception of the second memory transistor 37, and, for this reason, circuits and transistors are denoted by like reference numerals designating the corresponding circuits and transistors shown in FIG. 3.

In the second embodiment, the second memory transistor 37 is replaced with a third switching transistor 41 associated with a latching circuit 42 for gating the transistor 41, and the latching circuit 42 is selectively shifted in a set state and a reset state in the diagnostic mode of operation to cause the third switching transistor 41 to turn on or off. However, after the diagnostic mode of operation, the latching circuit 42 maintains the third switching transistor 41 off. The other circuit behavior is similar to the first embodiment, and the controlling signals from the controller 32 are summarized in Table 2.

TABLE 2

| Mode | 1st. S.W.Tr. | 1st. Memory | 2nd. S.W.Tr. | Latch | 3rd S.W.Tr. |
|---|---|---|---|---|---|
| A | GND | GND | GND | S or R | Vdd or GND |
| B | GND | GND | Vdd | S or R | Vdd or GND |
| C | Vpp or GND | Vpp or GND | GND | R | GND |
| D | GND | Vdd | Vdd | R | GND |

In Table 2, S and R are respectively indicative of the set state and the reset state.

Although particular embodiments of the present invention have been shown and described, it will be obvious to those skilled in the art that various changes and modifications may be made without departing from the spirit and scope of the present invention.

What is claimed is:

1. A redundant circuit incorporated in a non-volatile semiconductor memory device including a redundant memory cell array provided with a plurality of redundant memory cells, a memory cell array provided with a plurality of memory cells, and addressing means responsive to an external address signal for specifying an address assigned to each of said memory cells for an access, said non-volatile semiconductor memory device being selectively established into a diagnostic mode of operation before a packaging operation, a replacement mode of operation after the packaging operation and a read-out mode of operation, comprising:

(a) a memorizing facility having a plurality of component parts and capable of storing an address associated with one of said memory cells decided as a defective memory cell for producing a memorized address signal representative of said address associated with said one of said memory cells;

(b) replacing means supplied with said memorized address signal and with said external address and operative to produce an activation signal supplied to said redundant memory cell array and an inactivation signal supplied to said memory cell array for replacing said one of said memory cells with said redundant memory cell in said read-out mode of operation; and (c) diagnostic mode establishing means responsive to a test-mode signal for causing said non-volatile memory device to be shifted into said diagnostic mode of operation, in which each of said component parts comprises:

(c-1) a series combination of a first switching transistor, a first intermediate node and a first memory cell coupled between a source of a write-in voltage level and a source of a first voltage level, said first memory cell being formed by an erasable and programmable read only memory cell for memorizing a bit of said address associated with said one of said memory cells, (c-2) protective means provided in association with said first memory cell and operative to prevent the first memory cell from an erasing operation, (c-3) a series combination of a second switching transistor, a load transistor, a second intermediate node and second memory means coupled between a source of a second voltage level and said source of the first voltage level, said first intermediate node being coupled to said second intermediate node, said second memory means being implemented by an erasable and programmable read only memory cell without any protective means for temporally memorizing the bit of said address associated with said one of said memory cells, and (c-4) a controller producing a first controlling signal for said first switching transistor, a second controlling signal for said second switching transistor, a third controlling signal for said first memory transistor and a fourth controlling signal for said second memory means and in which said controller causes said first and third controlling signals to shift into a write-in voltage level for fixedly memorizing said bit of said address indicative of a first logic level and into an inactive voltage level for fixedly memorizing said bit of said address indicative of a second logic level in said replacement mode of operation, wherein said controller further causes said first and fourth controlling signals to shift into said write-in voltage level for temporally memorizing said bit of said address indicative of the first logic level and into the inactive voltage level for temporally memorizing said bit of said address indicative of the second logic level in said diagnostic mode of operation, said protective means being implemented by a shield film protecting said first memory transistor from an ultra-violet radiation.

2. A redundant circuit as set forth in claim 1, in which said first and second switching transistors are respectively implemented by n-channel type field effect transistors.

3. A redundant circuit as set forth in claim 2, in which said component part further comprises an inverter circuit coupled at the input node thereof to both of an intermediate node between said first switching transistor and said first memory cell and an intermediate node between said second switching transistor and said second memory means.

4. A redundant circuit as set forth in claim 1, in which said second memory means are formed by a third switching transistor associated with a latching circuit for gating the third switching transistor.

5. A redundant circuit for a memory cell array provided with a plurality of memory cells each replaceable with a redundant memory cell after the memory cell is decided as a defective memory cell in a diagnostic mode of operation, comprising:

(a) a memorizing facility having a plurality of component parts and capable of storing an address associated with one of said memory cells decided as said defective memory cell for producing a memorized address signal representative of said address associated with said one of said memory cells; and diagnostic mode establishing means responsive to a test mode signal and producing a first mode signal for said diagnostic mode of operation and a second mode signal for a replacement mode of operation carried out after the diagnostic mode of operation, in which each of said component parts comprises (i) a non-volatile memory cell responsive to said second mode signal for memorizing a piece of said address associated with said one of said memory cells in a non-erasable manner, (ii) a temporal memory cell shiftable between a memorizing state and a non-memorizing state and responsive to said first mode signal for establishing the memorizing state where said bit of said address associated with said one of said memory cells is stored, and (iii) a memorized signal producing circuit operative to produce a bit of said memorized address signal on the basis of said bit of said address associated with said one of said memory cells stored in one of said non-volatile memory cell and said temporal memory cell.

* * * * *

UNITED STATES PATENT AND TRADEMARK OFFICE
CERTIFICATE OF CORRECTION

PATENT NO. : 5,018,104
DATED : May 21, 1991
INVENTOR(S) : Takahiko Urai

It is certified that error appears in the above-identified patent and that said Letters Patent is hereby corrected as shown below:

Col. 2, line 46, delete "be";

Col. 2, line 48, after "to" insert --be--;

Col. 4, line 7, delete "is";

Col. 5, line 50, delete "writein" and insert therefor --write-in--;

Col. 6, line 63, delete the second occurrence of "the";

Col. 10, line 25, delete "piece" and insert therefor --bit--.

Signed and Sealed this

Fourth Day of May, 1993

Attest:

MICHAEL K. KIRK

Attesting Officer     Acting Commissioner of Patents and Trademarks